(12) United States Patent
Mutti

(10) Patent No.: US 8,120,466 B2
(45) Date of Patent: Feb. 21, 2012

(54) DECODING SCHEME FOR RFID READER

(75) Inventor: Carlo Mutti, Origlio (CH)

(73) Assignee: Assa Abloy AB (SE)

( * ) Notice: Subject to any disclaimer, the term of this patent is extended or adjusted under 35 U.S.C. 154(b) by 703 days.

(21) Appl. No.: 12/248,039

(22) Filed: Oct. 8, 2008

(65) Prior Publication Data

US 2010/0085163 A1   Apr. 8, 2010

(51) Int. Cl.
*H04Q 5/22* (2006.01)
*H04L 5/12* (2006.01)
*H04L 23/02* (2006.01)
*H04L 27/06* (2006.01)
*H03D 1/00* (2006.01)

(52) U.S. Cl. ........ 340/10.1; 375/262; 375/341; 375/343

(58) Field of Classification Search ............ 340/10; 375/262, 341, 343
See application file for complete search history.

(56) References Cited

U.S. PATENT DOCUMENTS

| 5,916,315 | A | 6/1999 | Ryan |
| 6,016,463 | A | 1/2000 | Ng |
| 6,233,289 | B1 | 5/2001 | Fredrickson |
| 6,289,060 | B1 | 9/2001 | Chen |
| 6,473,471 | B2 | 10/2002 | Lindquist et al. |
| 6,625,541 | B1 * | 9/2003 | Shenoy et al. ............... 702/6 |
| 6,868,325 | B2 * | 3/2005 | Menon et al. ............ 701/100 |
| 7,010,052 | B2 * | 3/2006 | Dill et al. ............... 375/265 |
| 7,349,878 | B1 * | 3/2008 | Makivic ................. 705/37 |
| 7,419,096 | B2 | 9/2008 | Esterberg et al. |
| 7,433,851 | B2 * | 10/2008 | Mirowski ............. 706/19 |
| 7,552,076 | B1 * | 6/2009 | Uenohara et al. ......... 705/36 R |
| 7,602,860 | B2 * | 10/2009 | Hietala et al. ........... 375/317 |
| 2004/0150551 | A1 * | 8/2004 | Artebrant et al. ........ 342/95 |
| 2004/0153430 | A1 * | 8/2004 | Sayad ................. 706/61 |
| 2005/0270185 | A1 * | 12/2005 | Esterberg ............... 341/50 |
| 2007/0096873 | A1 | 5/2007 | Sadr |
| 2007/0188305 | A1 | 8/2007 | Drucker |

FOREIGN PATENT DOCUMENTS

WO   WO 2007/090114   8/2007

OTHER PUBLICATIONS

Hagenauer J, Source-Controlled Channel Decoding, Sep. 1995, IEEE, vol. 43, pp. 2449-2457.*
Official Action for European Patent Application No. 09165123.2, dated Aug. 10, 2010.

* cited by examiner

*Primary Examiner* — Daniel Wu
*Assistant Examiner* — Mohamed Barakat
(74) *Attorney, Agent, or Firm* — Sheridan Ross P.C.

(57) ABSTRACT

The present invention is directed toward the recovery of RFID signals from RFID credentials. The recovery and subsequent interpretation of RFID signals may be accomplished by providing a set of predetermined probabilities for the occurrence of a symbol after another symbol in a received signal. The predetermined probabilities may be dependent only upon the encoding scheme used, thereby providing a more robust and less processor intensive decoding protocol than has previously been contemplated.

21 Claims, 9 Drawing Sheets

DECODING SCHEME FOR RFID READER

FIELD OF THE INVENTION

The present invention is generally directed to the detection and interpretation of signals, such as Radio Frequency signals received from a Radio Frequency Identification (RFID) device.

BACKGROUND

The detection and accurate decoding of signals in noisy or interference filled surroundings has always been a difficult task. At the reader the level of a received signal can be very low due to the low energy encoding scheme used to encode the signal. This further frustrates the detection and accurate decoding of signals.

Many receivers, such as Radio Frequency Identification (RFID) receivers, perform a symbol-by-symbol correlation on a received signal. The receiver then typically applies a maximum-likelihood sequence detector (MLSD) to the correlation outputs for the detection of information (e.g., ID number, account number, PIN, site code, and any other type of data that may be transmitted to a receiver) from the received signal. In literature, the symbol-error probability performance of encoding schemes used are often not provided, and even when it is provided it is not always correct. Examples of such decoding schemes or methods are given in U.S. Pat. No. 5,916,315, U.S. Pat. No. 6,233,289, US2005269408 or US2007188305 wherein it take also the name of Viterbi detectors. Such schemes are used for active RFID transponders because of the active transponder's ability to generate a relatively strong signal as compared to passive transponders. Active transponders have this increased ability because a local power source, such as a battery, assists in the generation of a signal whereas passive transponders rely completely upon resonance. Thus, reading distance is lost in passive transponders since there is no ability to compensate for decoding scheme sensitivities by amplifying the signal with an internal power source.

A more general and robust technique is described into US20070096873, wherein indeed a set of predetermined probabilities of symbol-error probability performance is provided. More exactly these probabilities are calculated and permanently adapted in function of variables as data pulse, timing and baud rates which are affecting the quality of the received signal. Even if extremely robust and exact, such decoding schemes have the drawback to consume tremendous computing resources and performances.

SUMMARY

It is, therefore, one aspect of the present invention to provide a more robust signal decoding scheme, outperforming the classical performance (reading distance) of classical symbol detector (Viterbi), without consuming as much resources as high-end detectors (see US20070096873). It is also an aspect of the present invention to provide a reader that is capable of executing the improved decoding scheme. More specifically, standard receivers generally perform symbol-by-symbol correlation followed by application of an MLSD algorithm. The present invention, on the other hand, is capable of applying a number of different decoding schemes.

In accordance with at least one embodiment of the present invention, a method of operating an RFID reader to decode an encoded data signal from at least one RFID tag, the encoded data signal being a first-order Markov process sequence of symbols, is provided that generally comprises:

receiving the encoded data signal from the at least one RFID tag;

determining a correlation value for each candidate symbol at each symbol interval in the data signal;

determining a modified correlation value for each candidate symbol at each symbol interval in the data signal, wherein the modified correlation value is based on a set of predetermined probabilities that a symbol occurs after another symbol, and wherein the set of predetermined probabilities are time independent and based on logic of the encoding scheme used to encode the data signal;

identifying, for each candidate symbol at each symbol interval, an unique possible candidate value in the previous symbol interval; and assembling a decoded symbol sequence with the identified symbol for each symbol interval.

In accordance with at least some embodiments of the present invention, a data structure comprising a plurality of nodes called a trellis is used, wherein each node being associate with a candidate symbol at a given symbol interval and the transition between the nodes are defined by the set of predetermined probabilities.

In accordance with at least some embodiments of the present invention, a reader is provided that generally comprises an antenna operable to receive an encoded data signal and a digital signal processor. The digital signal processor may be operable to determine a correlation value for each candidate symbol at each symbol interval in the data signal, determine a modified correlation value for each candidate symbol at each symbol interval in the data signal, wherein the modified correlation value is based on a set of predetermined probabilities that a symbol occurs after another symbol, and wherein the set of predetermined probabilities are time independent and based on logic of the encoding scheme used to encode the data signal, to identify, for each candidate symbol at each symbol interval, an unique possible candidate value in the previous symbol interval, and to assemble a decoded symbol sequence with the identified symbol for each symbol interval.

These and other advantages will be apparent from the disclosure of the invention(s) contained herein. The above-described embodiments and configurations are neither complete nor exhaustive. As will be appreciated, other embodiments of the invention are possible using, alone or in combination, one or more of the features set forth above or described in detail below.

DETAILED DESCRIPTION

The present invention is generally directed toward a signal decoding method, device, and system. The invention advantageously addresses deficiencies of the prior art and may be utilized within the context of access control or security systems, as well as be equally efficiently utilized in a broad range of other applications where contact-less data acquisition techniques are used (e.g., monitoring moving objects, tracking inventory, verifying credit cards, and the like).

Figure 1:
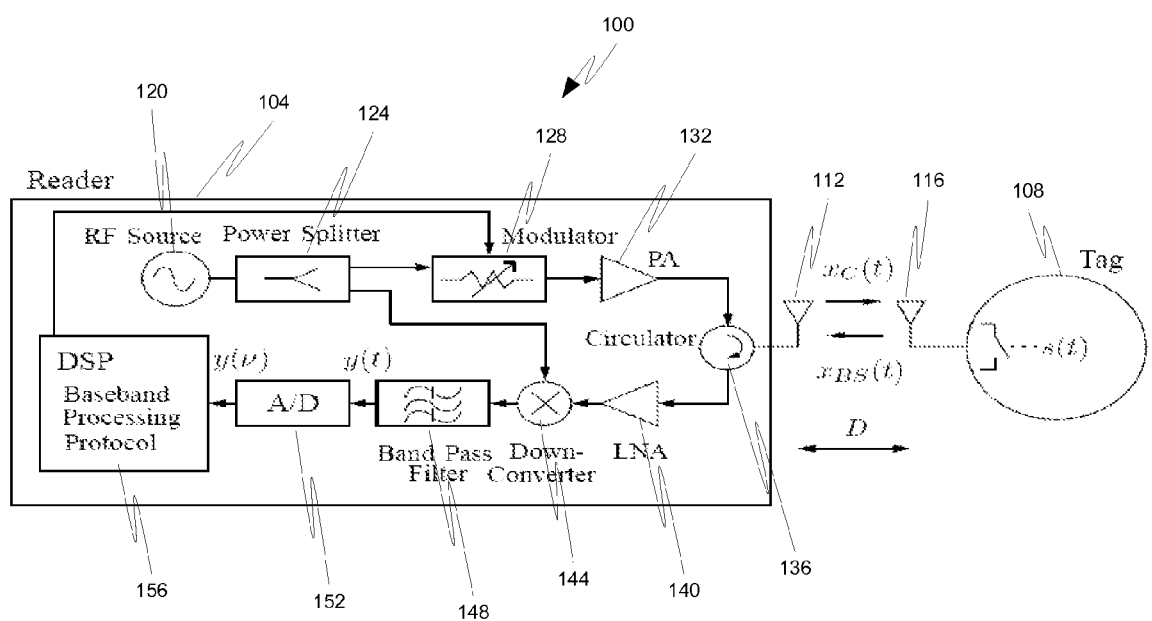
FIG. 1 is a block diagram depicting an RF transmitter-receiver system in accordance with at least some embodiments of the present invention.

Referring initially to FIG. 1, an exemplary transmitter-receiver system 100 is depicted in accordance with at least some embodiments of the present invention. The transmitter-receiver system 100 may comprise a reader 104 and a transponder or tag 108. The tag 108 may be a passive device which does not require power supplied from an internal power source. The electrical power required to operate a passive tag is supplied to the tag by electromagnetic energy transmitted from the reader 104. The electromagnetic energy may be generated at an antenna 112 of the reader 104 and received at an antenna 116 of the tag 108. Accordingly, a passive tag 108 is operational when it receives electromagnetic waves from the reader 104, which are of a specific frequency and of a sufficient strength to power up the tag 108. As can be appreciated, however, the tag 108 may alternatively be an active device which has some form of internal power supply (e.g., a battery or a similar energy storage device).

The tag 108 may comprise a number of functional elements including an integrated circuit (IC) that is connected to the tag's antenna 116. The IC embodies the processing and memory capabilities of the tag 108. The tag's antenna 116 is typically coupled to the IC and may be a conventional coil termed a "dual-function antenna coil" which is capable of performing both the receiving and transmitting functions of the tag 108. Alternatively, two separate receiving and transmitting antenna coils can be substituted for the single "dual function antenna coil" in the tag 108. The tag 108 may also optionally include an external transponder tuning capacitor coupled to the IC and to each antenna coil of the tag's antenna 116. The term "external" is used above with respect to the tag 108 to designate electronic components which are not physically or functionally included within the IC. The tag's antenna 116, in cooperation with the transponder tuning capacitor, if present, may be used to determine the carrier frequency of the tag 108.

In accordance with at least some embodiments of the present invention, the tag 108 may be equipped to communicate at a number of different carrier frequencies including, without limitation, LF: 125 kHz, 134.2 kHz, HF: 13.56 MHz, UHF: 868 MHz, 915 MHz, and MW: 2.45 GHz.

In accordance with at least some embodiments of the present invention, the tag 108 may be equipped to encode the data signal using a FM0 encoding scheme that is already used in the standards ISO 11784/5, ISO 18000-4, ISO 18000-6, and EPCglobal Class1 Gen2.

The tag 108 shown and described herein is but one example of a type of transponder having utility in the RFID system 100. It is understood that practice of the present invention is not limited to any one specific type of tag, but is generally applicable to most conventional types of tag having utility in RFID systems. Thus, for example, the tag can be selected from proximity cards, proximity tags, smart cards, or the like. It is further understood that practice of the present invention is not limited to RFID systems having only one tag and one reader as shown and described, but is generally applicable to RFID systems having any number of compatible tags/machine readable credentials and readers.

Furthermore, the tag 108 may be provided in a number of different form factors. For example, the tag 108 may be provided on or within a card as described above. Additionally, the tag 108 may be provided on or within a key fob, portable electronic device (e.g., laptop, Personal Digital Assistant (PDA), portable e-mail retrieval device, cellular phone, etc.), a computer, a phone, or any other generally portable device.

In most conventional RFID systems, the position of the reader 104 is stationary (i.e., constant) relative to the surrounding environment, while the position of the tag 108 is portable (i.e., variable) within the surrounding environment. In such cases, the user of the RFID system moves the portable tag 108 into relative proximity with the stationary reader 104 to enable simultaneous operation of the both the tag 108 and reader 104. In some conventional RFID systems, however, the position of the reader 104 may be portable relative to the surrounding environment, while the position of the tag 108 is either portable or stationary. In the case of a portable reader 104 and a stationary tag 108, the user moves the portable reader 104 into relative proximity with the stationary tag 108 to enable simultaneous operation of the both the tag 108 and reader 104. In the case of a portable reader 104 and a portable tag 108, the user may move both the portable reader 104 and the portable tag 108 into relative proximity with one another to enable simultaneous operation of the both the tag 108 and reader 104. Embodiments of the present invention are not limited to any one of the above-recited RFID system configurations.

The reader 104 of the present invention may comprise a number of functional elements including an RF source 120, a power splitter 124, a modulator 128, a power amplifier 132, a circulator 136, a low noise amplifier (LNA) 140, a down converter 144, a band pass filter 148, an analog-to-digital (A/D) converter 152, and a digital signal processor (DSP) 156. The RF source 120, power splitter 124, modulator 128, and power amplifier 132 generally correspond to excitation circuitry that functions to generate an excitation signal which the reader antenna 112 transmits in the form of electromagnetic waves into the open space of the external environment surrounding the reader 104. The excitation signals are received by the tag antenna 116 to electrically power up the tag 108.

In accordance with at least some embodiments of the present invention, the excitation signal may be a high voltage signal having a relatively high voltage, for example, within a range of about 75 to 125 Volts [V] zero to peak.

Although not shown, the reader 104 optionally includes a tuning capacitor coupled to the reader antenna 112. A power source (not shown) may be utilized to provide electrical operating power to the reader components in a controlled manner.

In accordance with one embodiment, the power source is coupled to a finite electrical power source which is self-contained (i.e., internal) within the reader 104, such as a relatively small portable battery consisting of one or more disposable dry cells or rechargeable cells. Alternatively, the power source is hard wired to an essentially infinite remote electrical power source, such as an electric utility or power grid.

When the tag 108 and/or the reader 104 is moved to a proximal position such that the distance D between the tag 108 and reader 104 is within the excitation signal reception range of the tag 108, the tag 108 receives the excitation signal on its antenna 116, which powers up the IC within the tag 108. Upon activation, the IC generates a data signal, which contains readable information, i.e., tag data, copied or otherwise derived from the memory of the IC. The data signal is transmitted into the open space of the external environment surrounding the tag 108 via the tag antenna 116.

In one embodiment, the data signal is a low voltage signal having a relatively low voltage, for example, within a range of about 1 to 100 milli-Volts [mV] (at the reader antenna 112).

In accordance with at least some embodiments of the present invention, the signal transmitted by the tag 108 may be encoded with the tag data. Any number of different encoding schemes may be utilized to encode the tag data on the carrier signal. Exemplary encoding schemes that may be used in accordance with embodiments of the present invention include, but are not limited to, encoding schemes that use two distinct sets of tag symbols (e.g., bi-phase signals). One such encoding scheme is the FM0 encoding scheme where a binary '0' has a transition in the middle of a symbol (i.e., in the half bit period), whereas a binary '1' does not. The resulting signal transmitted by the tag antenna 116 in such a configuration is a differential bi-phase (DBP) signal or more particularly an FM0 signal.

Other types of encoding scheme that may be used in accordance with embodiments of the present invention include the Miller, Manchester, and FM1 encoding schemes. The Miller encoding scheme, for example, offers some advantages over FM0. In spectral terms, the energy in a Miller signal is concentrated away from the carrier (roughly by the link frequency), making it easier to detect in the presence of phase noise and possible interference from other readers. In the time domain, interpretation of an FM0 symbol depends on a single edge, whereas a Miller symbol provides a number of edges to locate, reducing the likelihood of a bit error.

In accordance with at least one embodiment of the present invention, the reader antenna 112 is a "dual-function antenna coil" which performs both the receiving and transmitting functions of the reader 104. In particular, the reader antenna 112 may receive the transponder data signal from the external environment and transmit the excitation signal into the external environment. Alternatively, the reader 104 may encompass two separate receiving and transmitting antenna coils, respectively, which separately perform the receiving and transmitting functions of the reader 104.

Regardless of the construction, the reader 104 receives the encoded signal at the antenna 112 and passes it through the LNA 140 via the circulator 136. The signal is then passed through the down-converter 144 and band pass filter 148 to further condition the signal for processing. Consider, for example, FM0 codes, and suppose that the received signal after down-conversion is embedded in white Gaussian noise, i.e.:

$$y(t)=xBB(t)+\omega(t)=Ks(t)+\omega(t)$$

where the noise signal $\omega(t)$ is modeled as zero-mean additive white Gaussian noise with:

$$E[\omega(t+\tau)\omega(t)]=\sigma_n^2\delta(\tau)$$

and $\sigma_n^2$ is the noise power spectral density. Thereafter, the signal is passed through the A/D converter 152 where discrete samples of the analog signal are obtained and the signal is therefore converted into a digital signal (i.e., the signal is converted from y(t) to y(v)). More specifically, the output sequence includes samples described as:

$$y(v)=Ks(v)+\omega(v), v=1,\ldots,NN_s$$

which is the received signal y(t) sampled at time instants $t=vT_s/N$.

The sampling process results in a digitized version of the conditioned amplifier output signal termed the digital output signal, which the DSP 156 processes to extract the readable tag data contained therein. In particular, the DSP 156 detects and decodes the digital output signal in accordance with a respective encoding type by executing specific firmware and/or software that will be further described below. The extracted tag data may be sent to an external device, such as a central host computer (not shown), via an I/O interface, where permission to access an asset (e.g., room, computer, data, bank account, building, etc.) protected by the reader 104 may be granted or denied depending upon the tag data and the permissions associated therewith.

The DSP 156 may be adapted to implement an improved ML scheme. The improved ML scheme can be used with any type of decoding scheme in accordance with at least some embodiments of the present invention. What is proposed is an optimum MLSD scheme that utilizes some specific feature of the received coded signal. The MLSD scheme may be employed in any type of scenario (i.e., perfect synchronization and imperfect synchronization) for improving the overall system performance (i.e., reducing bit error rate and/or improving gain).

In accordance with at least some embodiments of the present invention, the MLSD scheme may use the fact that an FM0 signal has a memory (i.e., the symbols transmitted in successive intervals are not independent) and the fact that only certain sequences of symbols are allowed to enhance the overall detection scheme. More particularly, the FM0 symbols can be seen as a first-order Markov process and it can be completely described by a code state diagram (see FIG. 3) or by a probability matrix in which the elements are equal to conditional probabilities that a symbol occurs after another symbol. The MLSD is then computed in two steps. The first step comprises a trace forward step whereby the correlation values in each symbol interval for the waveform are calculated and stored in a data structure called a trellis. The transitions between symbols may be described by a probability matrix. The best preceding symbol (as determined by the conditional probabilities that are based on the encoding scheme used) is then determined and new correlation values are computed and stored in the trellis. The second step comprises a trace back step where the bit stream (i.e., the tag data) is assembled by iterating backward through the trellis (with new correlation values) starting from the end. More specifically, the starting point in the trellis is chosen based on the resulting highest correlation value. Therefore, the trellis created in the trace forward step is used for choosing the best predecessor. Additional details of the enhanced decoding schemes and MLSD scheme will now be described in further detail in accordance with at least some embodiments of the present invention.

Figure 2:
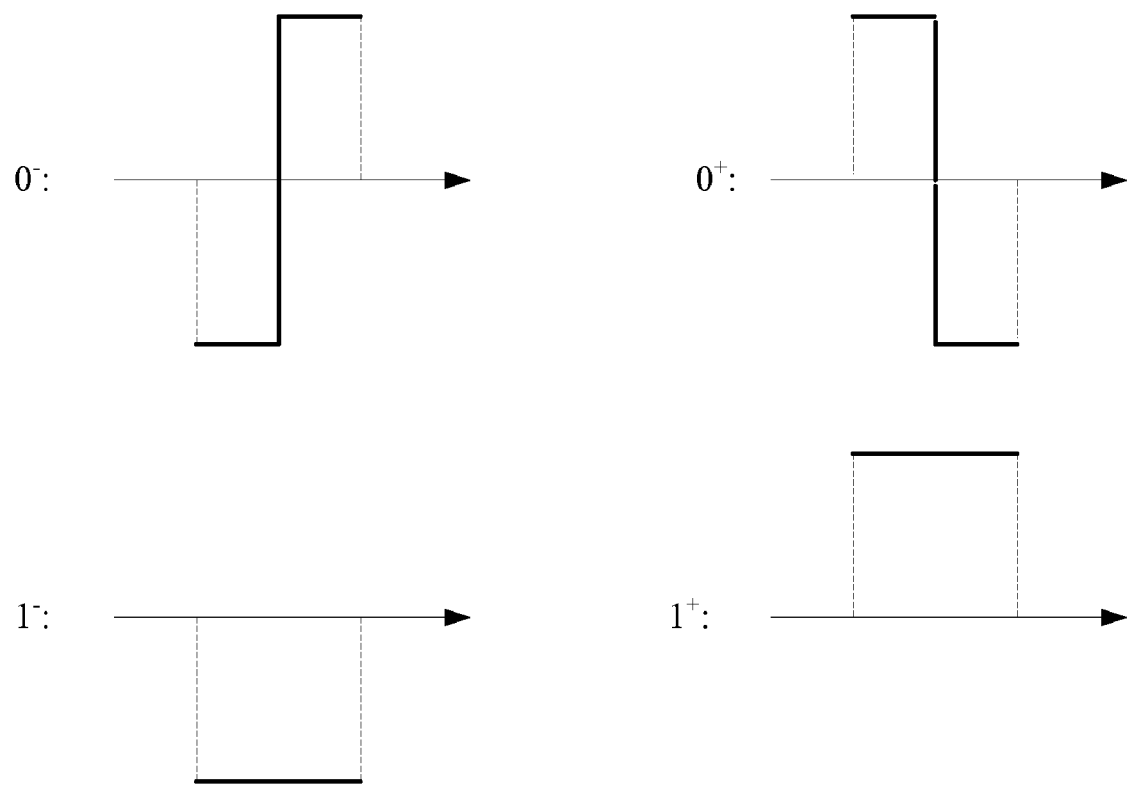
FIG. 2 is an illustration of FM0 coded symbols in a timing-diagram in accordance with at least some embodiments of the present invention.

Referring now to FIG. 2, FM0 symbols in a timing-diagram will be described in accordance with at least some embodiments of the present invention. In FM0 encoding, a logical '0' is coded by a transition in the half-bit period and a logical '1' is coded by the lack of a transition. Since after each symbol the level is inverted, for a symbol there are two possible '0' waveforms:

$$0^- = \begin{cases} -1 & 0 \leq t \leq T_S/2 \\ 1 & T_S/2 \leq t \leq T_S \end{cases} \text{ or } 0^+ = -0^-$$

and two possible '1' waveforms:

$$1^- = -1 \ 0 \leq t \leq T_s \text{ or } 1^+ = -1^-$$

As can be seen in FIG. 2, the symbol $0^-$ is defined as the logical '0' obtained from a half-bit transition from a low voltage to a relatively higher voltage. The symbol $0^+$ is defined as the logical '0' obtained from a half-bit transition from a high voltage to a relatively lower voltage. As can be appreciated, both the $0^-$ and $0^+$ symbols have the same logical value (i.e., zero), but each symbol is determined differently, especially in an FM0 coded signal. Accordingly, the symbols are considered different symbols since each corresponds to a different state of the encoded signal.

The symbol $1^-$ is defined as the logical '1' obtained from the lack of a half-bit transition at a relatively low voltage. Conversely, the symbol $1^+$ is defined as the logical '1' obtained from the lack of a half-bit transition at a relatively high voltage. Similar to the zero symbols, the $1^-$ and $1^+$ symbols have the same logical value (i.e., one), but each symbol is determined differently, especially in an FM0 coded signal. As can be appreciated by one skilled in the art, the states defined above in connection with FIG. 2 can vary and may be modified without departing from the spirit of the present invention. For example, the symbol $0^+$ may alternatively be defined as the logical '0' obtained from a rising half-bit transition and the symbol $0^-$ may be defined as the logical '0' obtained from a falling half-bit transition. The same reverse logic may be applied to define different $1^-$ and $1^+$ symbols. However, for sake of clarity, the symbols defined in FIG. 2 will be used to describe embodiments of the present invention from here forward.

Figure 3:
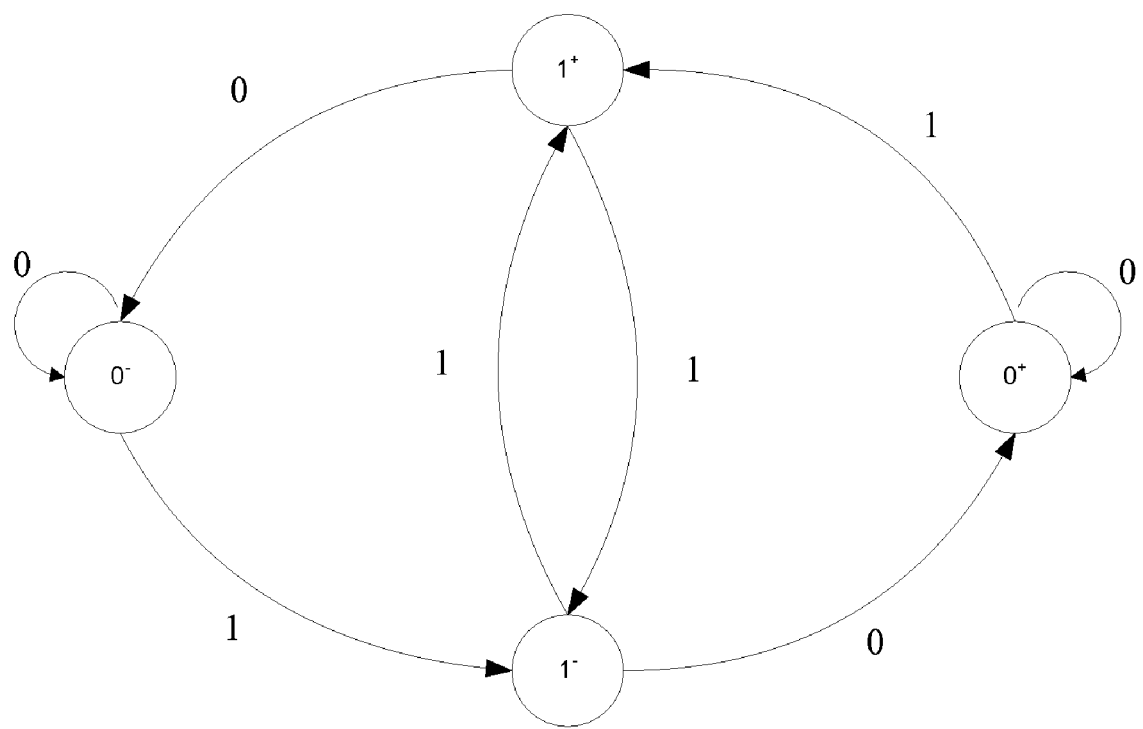
FIG. 3 is an illustration of a code state diagram in accordance with at least some embodiments of the present invention.

FIG. 3 depicts an exemplary code state diagram for the symbols defined in FIG. 2. The code state diagram shows the possible transitions between states and the corresponding logic values obtained via those transitions. From the code state diagram it can be seen that a coded symbol depends only on the previous coded symbol. The coded signal s(t) is a first-order Markov process and can be completely described by a probability matrix where P(j|i) is the conditional probability of the symbol j occurring after a given symbol i has occurred.

In accordance with at least one embodiment of the present invention, the probability matrix for FM0 codes is described as:

$$P_{FM0} = \begin{bmatrix} P(0^-|0^-) & P(0^-|0^+) & P(0^-|1^-) & P(0^-|1^+) \\ P(0^+|0^-) & P(0^-|0^+) & P(0^+|1^-) & P(0^+|1^+) \\ P(1^-|0^-) & P(1^-|0^+) & P(1^-|1^-) & P(1^-|1^+) \\ P(1^+|0^-) & P(1^-|0^+) & P(1^+|1^-) & P(1^+|0^+) \end{bmatrix}$$

$$= \begin{bmatrix} 0.5 & 0 & 0 & 0.5 \\ 0 & 0.5 & 0.5 & 0 \\ 0.5 & 0 & 0 & 0.5 \\ 0 & 0.5 & 0.5 & 0 \end{bmatrix}$$

As can be seen, many of the probabilities in the probability matrix for FM0 codes have a probability of zero. This is due to the fact that certain transitions do not occur in an FM0 code, such as from the state 1 to 0, for example. Utilizing this fact and generating the above probability matrix decreases the complexity of any correlation values calculated based on these probabilities. An MLSD decoding scheme for FM0 codes may take advantage of the probability matrix provided above to reduce processing requirements and increase the overall system robustness to symbol timing errors (since certain transitions are ignored). As noted above, the sequence of FM0 symbols can be seen as a first-order Markov process, and it can be completely described by a probability matrix in which the elements are equal to conditional probabilities that a symbol occurs after another symbol, as defined in the probability matrix provided above.

Figure 4:
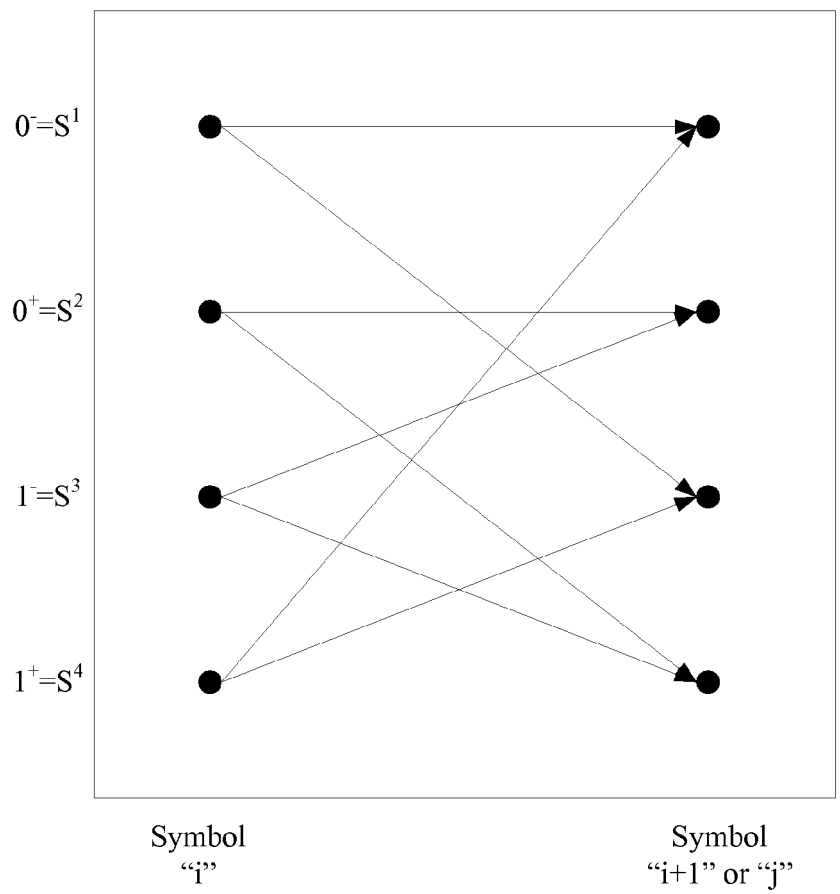
FIG. 4 is an exemplary trellis for FM0 codes created in accordance with at least some embodiments of the present invention.

Following the calculation of the probability matrix, correlations and a trellis are computed for FM0 codes using $P_{FM0}$. An example of the basic trellis for the FM0 codes is depicted in FIG. 4. By letting $S^k$ (where k=1, ..., 4 for FM0 codes) be the vectors containing the N sampled values of the waveforms '0' and '1', and as a consequence of the properties of the additive white Gaussian noise, the correlation outputs for the FM0 codes can be calculated as the following:

$$R_n^k = \langle [y(1+N(n-1)) \ldots y(Nn)], S^k \rangle, \forall k,n$$

The correlations for the FM0 codes represent a sufficient statistic for the estimation problem, where <a,b> denotes the inner product of two vectors a and b. In the example provided herein, n is assumed to be 1, ..., Ns, where Ns is the number of coded symbols in a received signal (i.e., the number of bits in the tag data).

Figure 5:
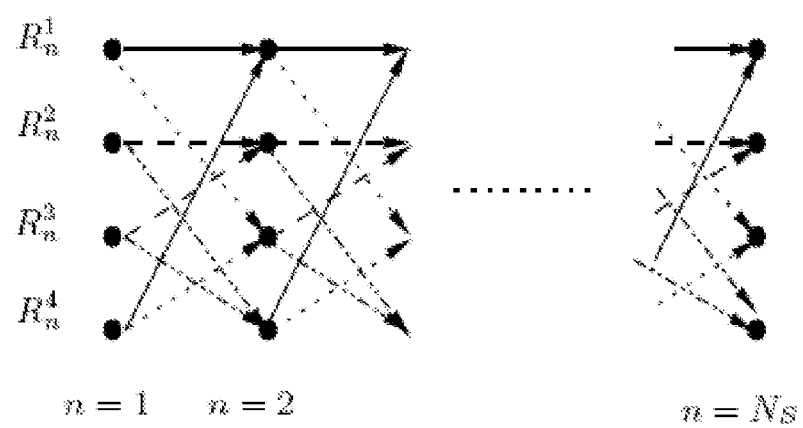
FIG. 5 is an exemplary extended trellis for Ns FM0 symbols in accordance with at least some embodiments of the present invention.

After the correlations values in each symbol interval for the waveform are calculated the trellis (where transitions between symbols are described by the transition matrix) is populated with the correlation values. FIG. 5 depicts and exemplary trellis used in the MLSD of FM0 codes. The length of the trellis is equal to the number of symbols/bits in the received signal (i.e., Ns in this example). The height of the trellis is based on the number of possible coded symbols used in the decoding scheme and the number of bits in each of these symbols.

After the trellis has been populated with the initially calculated correlation values, the modified correlation values are calculated based on the determined best preceding symbol according to the following sets of equations describing a forward iterative process starting from the first symbol interval to the last symbol interval.

$$\text{For } n = 1: \begin{aligned} \tilde{R}_1^1 &= R_1^1 \\ \tilde{R}_1^2 &= R_1^2 \\ \tilde{R}_1^3 &= R_1^3 \\ \tilde{R}_1^4 &= R_1^4 \end{aligned}$$

-continued

For $n > 1$:
$$\tilde{R}_n^1 = R_n^1 + \max\{\tilde{R}_{n-1}^1, \tilde{R}_{n-1}^4\}$$
$$\tilde{R}_n^2 = R_n^2 + \max\{\tilde{R}_{n-1}^2, \tilde{R}_{n-1}^3\}$$
$$\tilde{R}_n^3 = R_n^3 + \max\{\tilde{R}_{n-1}^1, \tilde{R}_{n-1}^4\}$$
$$\tilde{R}_n^4 = R_n^4 + \max\{\tilde{R}_{n-1}^2, \tilde{R}_{n-1}^3\}$$

As can be seen in the above equation, the modified correlation values are based on the previously calculated correlation values and the best preceding symbol. More specifically, a modified correlation value for a candidate symbol at a given time interval is calculated by adding the initially calculated correlation value for this candidate symbol at this given time interval and the maximum value of transition. The maximum value of transition for a selected symbol at a selected symbol interval is calculated on the result of the multiplication of the vector of probability provided in $P_{FM0}$ for this selected symbol by the vector of the modified correlation values of all candidate symbols at the previous interval. It should be noted that multiplication of the probability vector is one example of a way to ponder a candidate symbol. One skilled in the art will appreciate that many other ways to ponder a candidate symbol may be employed without departing from the scope of the present invention.

It should also be noted that in the set of equations above, the factor 0.5, being the unique non zero value in $P_{FM0}$ has been replaced by 1. This means for example that instead of calculating $\max\{0.5 \cdot \tilde{R}_{n-1}^1, 0.5 \cdot \tilde{R}_{n-1}^4\}$, one set the maximum value of transition for the $1^{st}$ symbol at the $n^{th}$ time interval as being $\max\{\tilde{R}_{n-1}^1, \tilde{R}_{n-1}^4\}$. In other words, the decoding scheme of the invention is also working even if the probability matrix $P_{FM0}$ has been un-normed (the norm value of each vector of probabilities being then different than 1). This factor increase on the value obtained for each modified correlation value (cumulative though the iterative process) is not influencing the decoding result itself. By setting all non-zero probabilities to 1, one decreases the computing resources needed.

Figure 6:
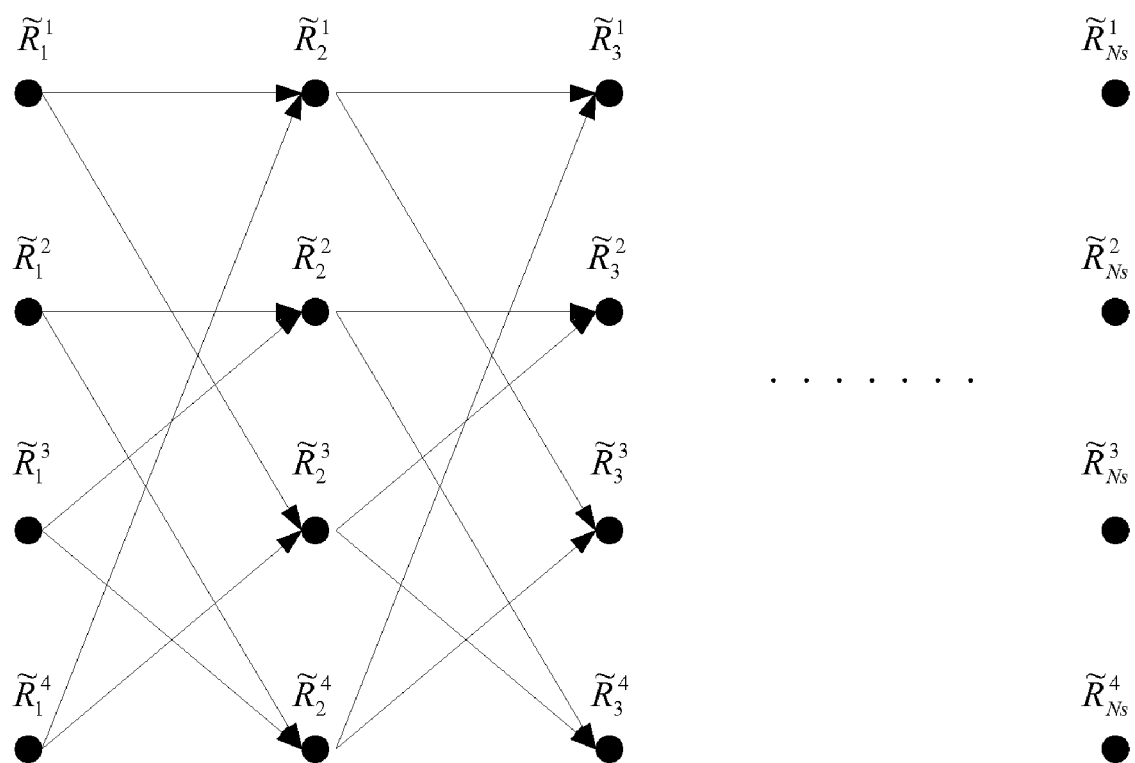
FIG. 6 is an exemplary trellis with correlation values calculated in accordance with at least some embodiments of the present invention.

FIG. 6 depicts an exemplary trellis comprising modified correlation values $\tilde{R}$ in the trellis. The depicted trellis includes nodes, each of which (for $n \geq 2$) has two input arrows. Each node of the trellis also includes two output arrows corresponding to possible transitions to a subsequent symbol. All iterations of the trellis, such as the iteration depicted in FIG. 6, may be stored in memory such that the DSP 156 can access the trellis, update the trellis, and analyze the trellis. The location of the memory in which the trellis is stored may vary depending upon the capabilities of the reader 104. For instance, the trellis may be stored in an internal memory of the DSP 156 (i.e., a cache memory or the like). Alternatively, the trellis may be stored in a memory location that is external to the DSP 156 but is accessible by the DSP 156. Such an external memory may include a solid-state memory device such as a RAM, ROM, PROM, EEPROM, flash memory, or the like. Those skilled in the art will appreciate that there may be many other ways to store the trellis in the reader 104 during decoding operations. Those skilled in the art will also appreciate that the trellis may not necessarily be stored in the reader 104, but may be situation in a location that is accessible by the reader 104 and DSP 156.

Complementary to the calculation of the modified correlation value, a unique possible candidate symbol at the previous symbol interval for each corresponding candidate symbol at each symbol interval is identify. It is in fact the candidate symbol corresponding to the maximum value of transition for the corresponding candidate symbol. When the maximum value of transition is determined (as described above), the identity of the corresponding previous symbol is also determine and stored. Independently of the way this information is stored, it is equivalent to keep only one input arrow for the corresponding node of the trellis. At the end of the forward iterative process, all nodes have only one unique possible previous node.

After, the bit stream is assembled by iterating through the trellis starting from the last symbol interval of the sequence to the start. The candidate symbol having the highest modified correlation value at the last symbol interval is firstly identified as being the decoded symbol at the last symbol interval. Then each, previous decoded symbol interval for each symbol interval of the sequence is iteratively assembled, according the identified unique possible candidate symbol at the previous symbol interval for the corresponding decoded symbol.

Figure 7:
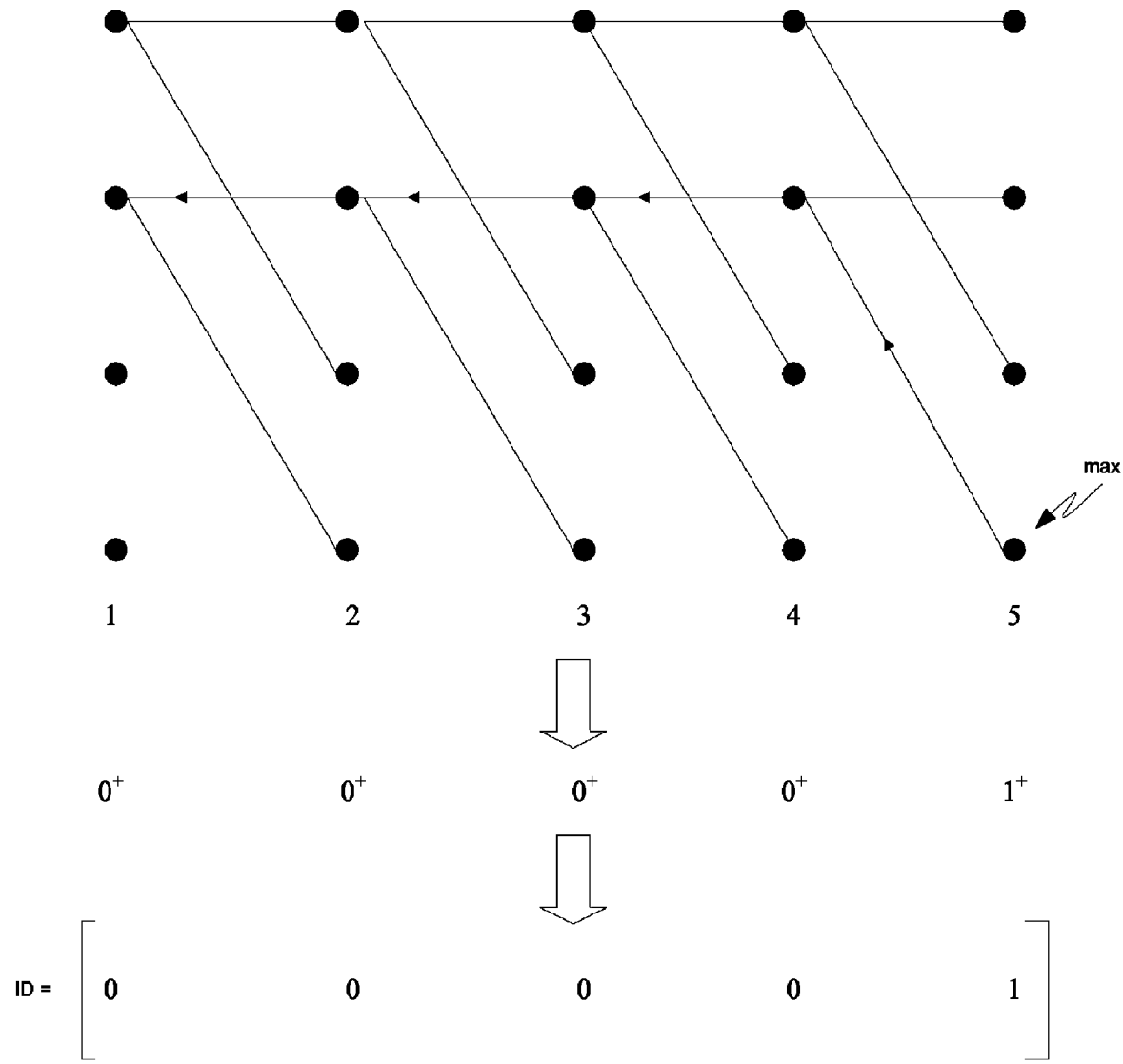
FIG. 7 depicts an exemplary process of assembling a received signal based on determining the maximum value for each interval of coded symbols in accordance with at least some embodiments of the present invention.

Referring now to FIG. 7, assume that 5 symbols (i.e., Ns=5) were included in the received signal. By beginning at the last symbol interval (i.e., the fifth symbol interval) the highest modified correlation value is chosen among the candidate nodes at the last symbol interval. In the depicted example, the fourth node corresponding to the fourth symbol (i.e. $1^+$) has the highest modified correlation value of the four nodes in the last symbol interval. In the immediately previous symbol interval (i.e., the fourth symbol interval the modified correlation is "defined" after choosing the node in the last symbol interval. In the depicted example, the second node corresponding to the second symbol (i.e., 0+) is connected with the fourth node in the last symbol interval, and thus the second node in the fourth symbol interval is "selected". This line represents the transition that most likely occurred between the fourth and fifth coded symbols.

This process of iterating back through the trellis continues at each symbol interval until the entire bit stream is assembled. Thus, the trellis created in the trace forward step is directly used for choosing the best predecessor in the track backward step, without any additional calculation. Each node selected during the track backward step corresponds to a symbol that was defined in FIG. 2 and each of those symbols corresponds to a logical '0' or '1' value. The logical '0' and '1' values are then sequentially ordered to determine the tag data (e.g., the ID number transmitted from the tag 108 to the reader 104).

Figure 8:
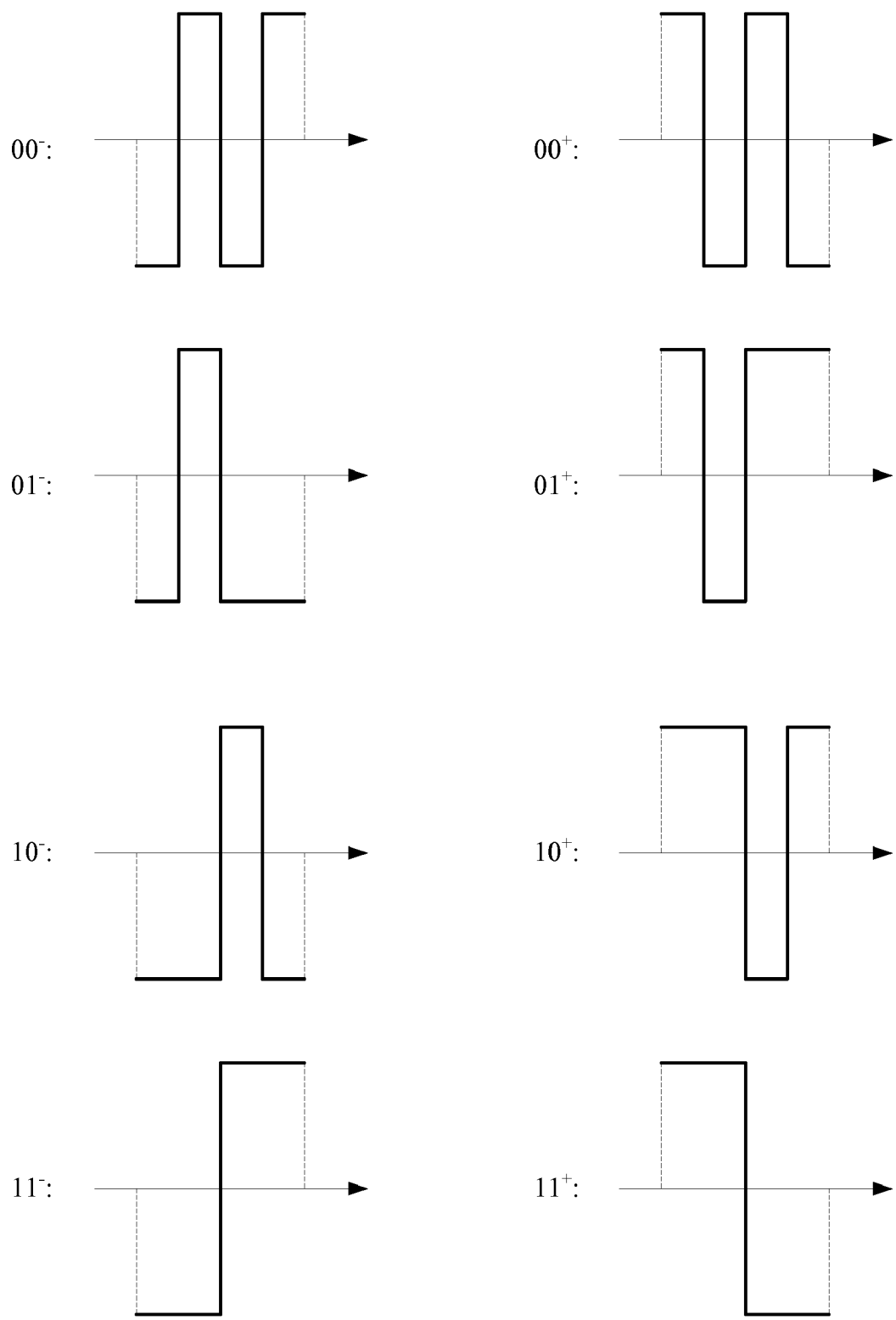
FIG. 8 is an illustration of eight FM0 coded symbols used for two symbol-by-symbol detection in accordance with at least some embodiments of the present invention.
Figure 9:
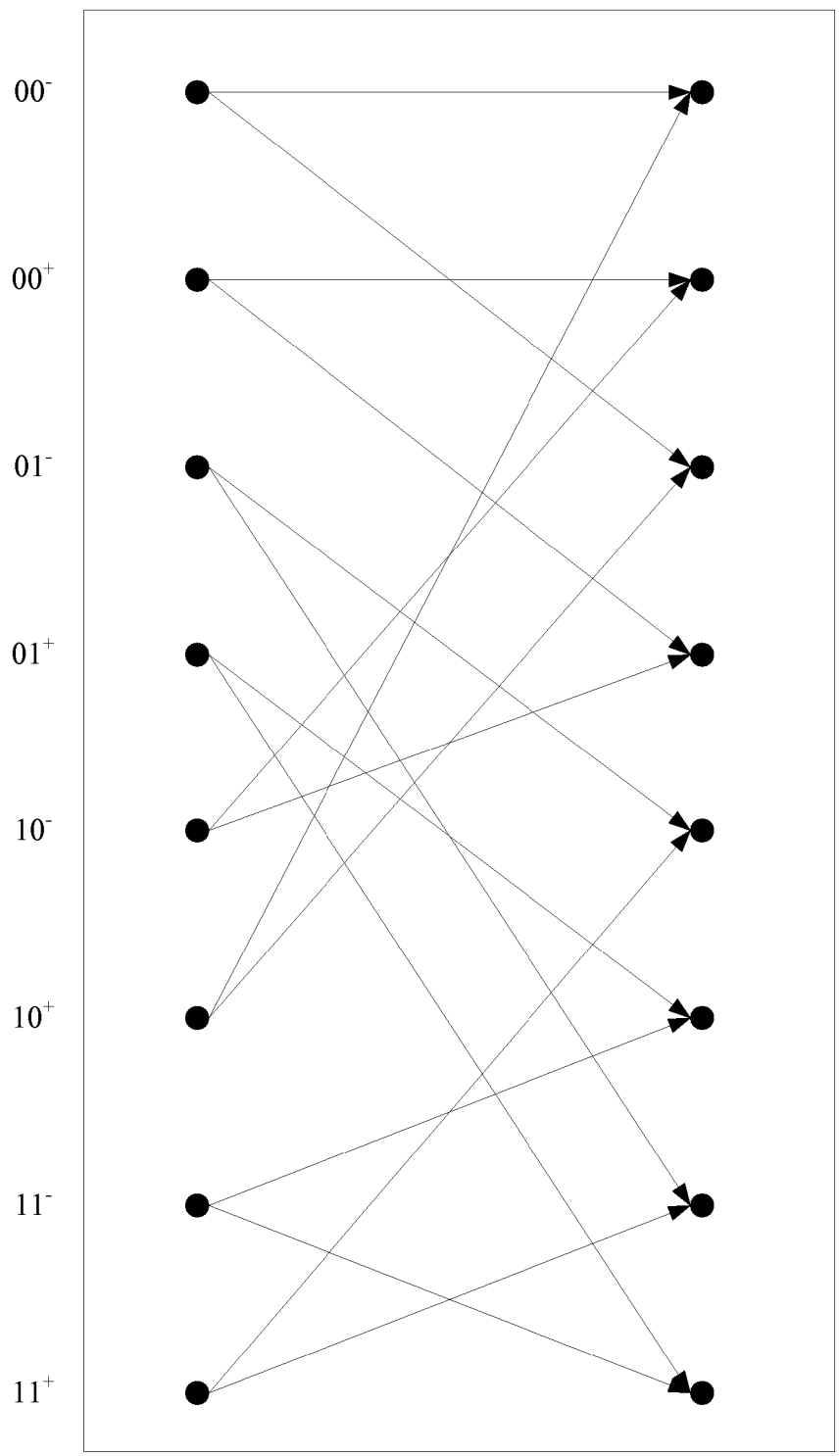
FIG. 9 is an exemplary trellis for two symbol-by-symbol detection in accordance with at least some embodiments of the present invention.

Referring now to FIG. 8, an alternative embodiment of the present invention will be described. More particularly, up to this point only examples depicting one symbol-by-symbol detection methods using a pattern of one FM0 encoded bit have been discussed. However, certain embodiments of the present invention can provide a symbol-by-symbol detection using a pattern of multiple encoded bits. For instance, 8 coded symbols may be defined for FM0 codes, where each of the 8 coded symbols correspond to the possible pairs of symbols in FM0 codes. A trellis, such as the one depicted in FIG. 9, may then be generated for the pairs of symbols. It should be noted that each node (other than the nodes in the first symbol interval) have two inputs from other nodes. This is similar to the trellis used for symbol-by-symbol detection using a pattern of one bit. After the trellis has been generated it is populated with correlation values at each node. In this case, the correlation may be computed with the "pattern" of two FM0 encoded bits. Moreover, the fact that only certain correlation patterns can overlap is used to further simplify the trellis.

After the trellis has been populated with correlation values, the modified correlation values are computed in a similar fashion to the symbol-by-symbol detection using a pattern of one bit. The modified correlation values are then stored in the modified trellis as also the identity of each unique possible candidate symbol at the previous symbol interval for each corresponding candidate symbol at each symbol interval. At this point, the trellis can be traversed backwards to assemble the bit stream. It should be appreciated that a higher level of symbol groupings may be used for symbol detection. The only consequence would be a more complex trellis, which may or may not be desirable depending upon the capabilities of the DSP 156.

It can be shown that the proposed MLSD scheme for perfect and imperfect synchronization has a significantly higher tolerance for symbol timing errors compared to standard schemes. Moreover, the proposed MLSD scheme can be used in connection with either perfect or imperfect synchronization decoding schemes, and it is suited for improving the reading distance and signal detection.

Figure 10:
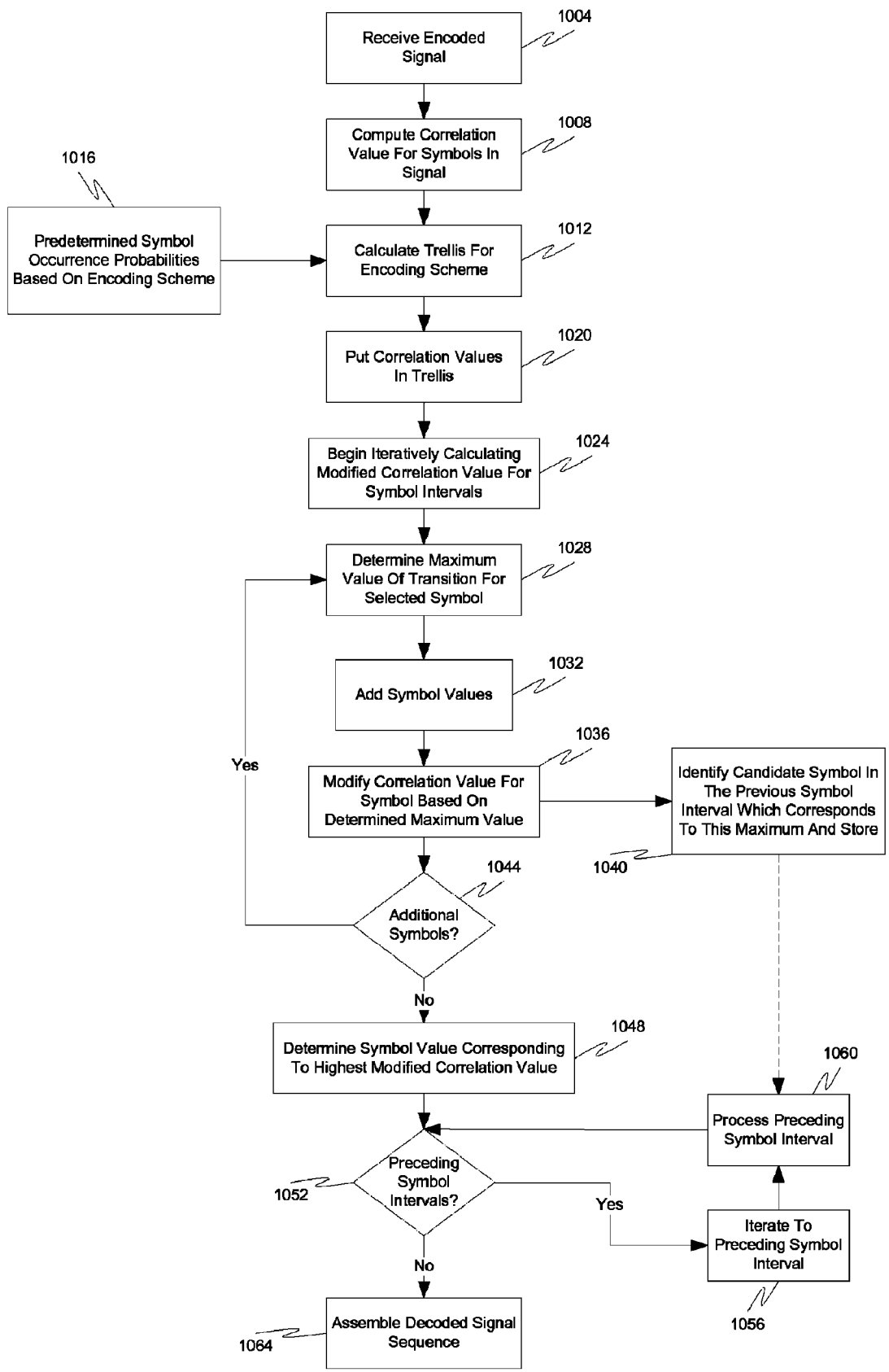
FIG. 10 is a flow chart depicting an exemplary decoding method in accordance with at least some embodiments of the present invention.

With reference now to FIG. 10, an exemplary symbol decoding/detection method will be described in accordance with at least some embodiments of the present invention. The method is initiated when an encoded signal is received at the reader 104 (step 1004). The signal may be encoded with any known type of symbol-based encoding algorithm such as FM0, FM1, Miller, Manchester, etc. The DSP 156 continues by calculating a trellis specific to the encoding scheme (step 1012) based on computed correlation values for symbols in the signal (step 1008) as well as the predetermined symbol occurrence probabilities (step 1016). The predetermined probabilities provided in step 1016 may be based on the encoding scheme used by the tag 108. For example, specific knowledge of the fact that certain symbol transitions do not occur in a given encoding scheme may be used to simplify the trellis since the corresponding probability of that transition can be set equal to zero. This helps eliminate possible transitions in the trellis.

Once the trellis has been populated with the initially calculated correlation values, the DSP 156 continues by placing the correlation values in the trellis (step 1020). The correlation value for each is placed in the trellis at a node corresponding to that particular symbol. In this step, and in accordance with at least some embodiments of the present invention, every node in the trellis is provided with some correlation value, even if the correlation value has been computed to be equal to zero.

After the trellis has been completely populated with the correlation values, the DSP 156 continues by iteratively calculating the modified correlation value for each symbol at each symbol interval in the trellis (step 1024). The DSP 156 firstly determines the maximum value of transition for a selected symbol at a selected symbol interval (i.e., a selected node) in the trellis (step 1028). The maximum value of transition for a selected symbol at a selected symbol interval is calculated on the result of the multiplication of the vector of probability provided for this selected symbol by the vector of the modified correlation values for all candidate symbols at the previous interval.

The modified correlation value is then simply calculated by adding the determined maximum value of transition (step 1032) to the correlation value which has been previously determined (in step 1008) for this selected candidate symbol at the selected symbol interval.

By determining the maximum value of transition for a selected symbol at a selected symbol interval (step 1028), the DSP is also able to identify in the same time the candidate symbol in the previous symbol interval which correspond to this maximum, and store it as the unique possible candidate symbol at the previous symbol interval for the selected symbol (step 1040).

After the node has been modified in the trellis with the modified correlation value, the DSP 156 determines if there are any additional symbols in the trellis that have not had a modified correlation value calculated in association therewith (step 1044). If there are any additional symbols in the trellis that do not have a modified correlation value, then the method returns to step 1028.

Once every node in the trellis has been updated with a modified correlation value, the DSP 156 continues by locating the last symbol interval (i.e., last column) in the trellis. The DSP 156 analyzes each node in the last symbol interval to determine which node (i.e., symbol) has the highest determined probability of occurring at that symbol interval. This probability determination is based on selecting the node with the highest modified correlation value in this last interval (step 1048). This information is obtained from the maximum value that was determined in the forward iteration through the trellis.

Thereafter, the DSP 156 determines if there are any preceding symbol intervals in the received signal (step 1052). If there are previous symbol intervals, then the DSP 156 iterates to the previously preceding symbol interval (i.e., the previous symbol interval for the corresponding decoded but assembled symbol) (step 1056). In other words, the DSP 156 incrementally steps backwards through the trellis until the beginning of the trellis, where in each preceding symbol interval the node (or symbol) has been uniquely determined in step 1040. At each step in the backward iteration, the DSP 156 will add the uniquely determined symbol from the symbol interval to the already assembled signal (step 1060). At the end, the method continues with the DSP 156 assembling the decoded signal sequence (step 1064). More particularly, the DSP 156 relates the symbols identified in step 1044 and 1052 to logical values, which correspond to tag data, for example. The decoded tag data may then be used for any number of purposes (e.g., determining permission rights for a holder of the tag 108, identifying the tag 108 or an object associated therewith, and so on).

The present invention, in various embodiments, includes components, methods, processes, systems and/or apparatus substantially as depicted and described herein, including various embodiments, sub combinations, and subsets thereof. Those of skill in the art will understand how to make and use the present invention after understanding the present disclosure. The present invention, in various embodiments, includes providing devices and processes in the absence of items not depicted and/or described herein or in various embodiments hereof, including in the absence of such items as may have been used in previous devices or processes, e.g., for improving performance, achieving ease andor reducing cost of implementation.

In accordance with at least one embodiment of the present invention, a receiver may also be provided that is capable of outperforming standard decoding schemes if there is not perfect symbol synchronization. Standard decoding schemes are very sensitive to symbol timing errors. On the other hand, a reader employing a decoding scheme in accordance with at least some embodiments of the present invention may be more robust to these symbol timing errors and the synchronization part (if tag detection is desired) is minimized. A reader used during imperfect synchronization may slide the received signal and compute correlations at each sample shift. Afterwards, an ML detector or a MLSDis applied to the correlation outputs. Additionally, the nature of certain encoding schemes, such as FM0 codes, may allow the reader to use the known half-bit before and after each symbol to improve the performance of the correlation. Such a decoding scheme is more robust to symbol timing errors than standard schemes and may also enable the reader to accurately read tag from a greater distance.

The foregoing discussion of the invention has been presented for purposes of illustration and description. The foregoing is not intended to limit the invention to the form or forms disclosed herein. In the foregoing Detailed Description for example, various features of the invention are grouped together in one or more embodiments for the purpose of streamlining the disclosure. This method of disclosure is not to be interpreted as reflecting an intention that the claimed invention requires more features than are expressly recited in each claim. Rather, as the following claims reflect, inventive aspects lie in less than all features of a single foregoing disclosed embodiment. Thus, the following claims are hereby incorporated into this Detailed Description, with each claim standing on its own as a separate preferred embodiment of the invention.

Moreover though the description of the invention has included description of one or more embodiments and certain variations and modifications, other variations and modifications are within the scope of the invention, e.g., as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A method of operating a Radio Frequency Identification (RFID) reader to decode an encoded data signal from at least one RFID tag, the encoded data signal being a first-order Markov process sequence of symbols, the method comprising:
   receiving the encoded data signal from the at least one RFID tag;
   determining a correlation value for each candidate symbol at each symbol interval in the data signal;
   determining a modified correlation value for each candidate symbol at each symbol interval in the data signal, wherein the modified correlation value is based on a set of predetermined probabilities that a symbol occurs after another symbol, wherein the set of predetermined probabilities are time independent and based on logic of the encoding scheme used to encode the data signal, and wherein at least one candidate symbol comprises a modified correlation value of zero based on the fact that a symbol transition ending with the at least one candidate symbol does not occur in the encoding scheme;
   identifying, for each candidate symbol at each symbol interval including that at least one candidate symbol, an unique possible candidate value in the previous symbol interval; and
   assembling a decoded symbol sequence with the identified symbol for each symbol interval.

2. The method of claim 1, wherein the set of predetermined probabilities depend only on the logic of the encoding scheme used.

3. The method of claim 1, wherein the encoded data signal is a differential bi-phase signal, more particularly a FM0 signal.

4. The method of claim 1, wherein determining a modified correlation value is achieved by calculating iteratively starting from the first symbol interval a modified correlation value for each candidate symbol at each symbol interval, this calculation comprising the steps of: determining a maximum value of transition for each candidate symbol, wherein the maximum value of transition for each candidate symbol is calculated at each symbol interval as the result of multiplying a vector of probability provided for a selected symbol by a vector of the modified correlation values for all candidate symbols at a preceding symbol interval; and
   adding the maximum value of transition to the correlation value determined for the corresponding candidate symbol.

5. The method of claim 4, wherein the identified unique possible candidate symbol at the previous symbol interval for each corresponding candidate symbol at each symbol interval is the candidate symbol corresponding to the maximum value of transition for the corresponding candidate symbol.

6. The method of claim 1, wherein assembling the decoded symbol sequence comprises:
   first identifying the candidate symbol having the highest modified correlation value at the last symbol interval of the sequence as being the decoded symbol at the last symbol interval;
   thereafter, iteratively assembling each previous decoded symbol for each symbol interval of the sequence, this previous decoded symbol corresponding to the identified unique possible candidate symbol at the previous symbol interval for the corresponding decoded symbol.

7. The method of claim 1, wherein all the probabilities that a symbol occurs after another symbol can have only two possible different values, these two values are a zero value and a non-zero value.

8. The method of claim 7, wherein the probability value is zero if the transition between the two symbols does not correspond to a possible transition according to the encoding scheme used to encode the data signal and wherein the probability value is the non-zero value if the transition between the two symbols does correspond to a possible transition according to the encoding scheme used to encode the data signal.

9. The method of claim 7, wherein the non-zero value is 1 and wherein the cumulative value of all probabilities in the set of probabilities is different than 1.

10. The method of claim 1, wherein a data structure comprising a plurality of nodes called a trellis is used, wherein each node being associate with a candidate symbol at a given symbol interval and the transition between the nodes are defined by the set of predetermined probabilities, and wherein,
    first, the correlation values are stored in the nodes of a data structure,
    thereafter, the trellis is upgraded iteratively, forward from the start to the end of the trellis, by determining the modified correlation value of each node,
    and, for each node, a unique possible previous node is determined corresponding to the unique identified possible candidate symbol in the previous symbol interval for the corresponding candidate symbol, and finally, the decoded symbol sequence can be assembled by iterating through the data structure starting by the symbol having the highest modified correlation value at the last symbol interval and ending at the first symbol interval following the unique path defined by each unique possible previous node.

11. A processor operable to execute the steps of claim 1 upon receipt of the encoded data signal.

12. A non-transitory computer readable medium comprising processor executable instructions that, when executed, perform the steps of claim 1.

13. A reader, comprising:
an antenna operable to receive an encoded data signal, the encoded data signal being a first-order Markov process sequence of symbols; and
a digital signal processor operable
to determine a correlation value for each candidate symbol at each symbol interval in the data signal,
to determine a modified correlation value for each candidate symbol at each symbol interval in the data signal, wherein the modified correlation value is based on a set of predetermined probabilities that a symbol occurs after another symbol, wherein the set of predetermined probabilities are time independent and based on logic of the encoding scheme used to encode the data signal, and wherein at least one candidate symbol comprises a modified correlation value of zero based on the fact that a symbol transition ending with the at least one candidate symbol does not occur in the encoding scheme,
to identify, for each candidate symbol at each symbol interval, an unique possible candidate value in the previous symbol interval, and
to assemble a decoded symbol sequence with the identified symbol for each symbol interval.

14. The reader of claim 13, wherein the set of predetermined probabilities depend only on the logic of the encoding scheme used.

15. The reader of claim 13, wherein the encoded data signal is a differential bi-phase signal, more particularly a FM0 signal.

16. The reader of claim 13, wherein the digital signal processor is further operable to calculate a modified correlation value for each candidate symbol at each symbol interval, by
determining a maximum value of transition for each candidate symbol wherein the maximum value of transition for each candidate symbol is the maximum of the modified correlation values for each candidate symbol at the previous symbol interval pondered by the set of predetermined probabilities for the candidate symbol; and
adding the maximum value of transition to the correlation value determined for the corresponding candidate symbol.

17. The reader of claim 16, wherein the identified unique possible candidate symbol at the previous symbol interval for each corresponding candidate symbol at each symbol interval is the candidate symbol corresponding to the maximum value of transition for the corresponding candidate symbol.

18. The reader of claim 13, wherein the digital signal processor is further operable to
first identify the candidate symbol having the highest modified correlation value at the last symbol interval of the sequence as being the decoded symbol at the last symbol interval;
thereafter, iteratively assembly each previous decoded symbol for each symbol interval of the sequence, this previous decoded symbol corresponding to the identified unique possible candidate symbol at the previous symbol interval for the corresponding decoded symbol.

19. The reader of claim 13, wherein all the probabilities that a symbol occurs after another symbol can have only two possible different values, these two values are a zero value and a non-zero value.

20. The reader of claim 19, wherein the probability value is zero if the transition between the two symbols does not correspond to a possible transition according to the encoding scheme used to encode the data signal and wherein the probability value is non-zero if the transition between the two symbols does correspond to a possible transition according to the encoding scheme used to encode the data signal.

21. The reader of claim 19, wherein the non-zero value is 1 and wherein the cumulative value of all probabilities in the set of probabilities is different than 1.

* * * * *